United States Patent
Nair et al.

(10) Patent No.: US 12,094,525 B2
(45) Date of Patent: Sep. 17, 2024

(54) MULTICHANNEL MEMORY TO AUGMENT LOCAL MEMORY

(71) Applicant: International Business Machines Corporation, Armonk, NY (US)

(72) Inventors: Ravi Nair, Briarcliff Manor, NY (US); Swagath Venkataramani, White Plains, NY (US); Vijayalakshmi Srinivasan, New York, NY (US); Arvind Kumar, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 17/814,254

(22) Filed: Jul. 22, 2022

(65) Prior Publication Data
US 2024/0029786 A1    Jan. 25, 2024

(51) Int. Cl.
*G11C 11/4096* (2006.01)
*G11C 5/06* (2006.01)
*G11C 11/4093* (2006.01)

(52) U.S. Cl.
CPC ............ *G11C 11/4096* (2013.01); *G11C 5/06* (2013.01); *G11C 11/4093* (2013.01)

(58) Field of Classification Search
CPC .... G11C 11/4096; G11C 5/06; G11C 11/4093
USPC .................................................. 365/189.011
See application file for complete search history.

(56) References Cited

U.S. PATENT DOCUMENTS

| | | | |
|---|---|---|---|
| 10,732,878 B1 | 8/2020 | Muthiah | |
| 10,817,422 B2 | 10/2020 | Jayasena | |
| 11,836,102 B1 * | 12/2023 | Mathuriya | G06N 20/00 |
| 11,844,223 B1 * | 12/2023 | Mathuriya | G11C 11/4097 |
| 2011/0035529 A1 | 2/2011 | Wang | |
| 2016/0117223 A1 | 4/2016 | Mnich | |
| 2021/0209047 A1 | 7/2021 | Kim | |
| 2021/0248072 A1 | 8/2021 | Kumar | |
| 2021/0312952 A1 | 10/2021 | Jayasena | |
| 2023/0267003 A1 * | 8/2023 | Lichtenau | G06F 9/5016 718/104 |

OTHER PUBLICATIONS

PCT/EP2023/069060 International Search Report and Written Opinion, mailed Oct. 11, 2023, 9 pgs.
(Continued)

*Primary Examiner* — Connie C Yoha
(74) *Attorney, Agent, or Firm* — Stosch Sabo

(57) ABSTRACT

A memory system, a method of assembling the memory system, and a computer system. The memory system includes a global memory device coupled to a plurality of processing elements. The global memory device is positioned external to a chip on which the plurality of processing devices reside. The memory system also includes at least one main scratchpad coupled to the at least one processing element of the plurality of processing devices and the global memory device. The memory system further includes a plurality of auxiliary scratchpads coupled to the plurality of processing elements and the global memory device. The one or more auxiliary scratchpads are configured to store static tensors. At least a portion of the plurality of auxiliary scratchpads are configured as a unitary multichannel device.

20 Claims, 10 Drawing Sheets

(56) References Cited

OTHER PUBLICATIONS

A. Shahab, M. Zhu, A. Margaritov and B. Grot, "Farewell My Shared LLCI A Case for Private Die-Stacked DRAM Caches for Servers," 2018 51st Annual IEEE/ACM International Symposium on Microarchitecture (MICRO), 2018, pp. 559-572, doi: 10.1109/MICRO.2018.00052.

M. O'Connor et al., "Fine-Grained DRAM: Energy-Efficient DRAM for Extreme Bandwidth Systems," 2017 50th Annual IEEE/ACM International Symposium on Microarchitecture (MICRO), 2017, pp. 41-54. https://ieeexplore.ieee.org/document/8686544.

* cited by examiner

MULTICHANNEL MEMORY TO AUGMENT LOCAL MEMORY

BACKGROUND

The present disclosure relates to random access memory (RAM) devices, and, more specifically, toward augmenting capacity of the main on-chip scratchpad for a processing core.

At least some known special purpose accelerators, e.g., and without limitation, deep-learning accelerators, include an interconnected set of processing cores within a multicore processing device, where each core uses a local memory, or scratchpad, for quick access to its working set, and can access a global memory to periodically, or continually, replenish the contents of the scratchpad. The scratchpad is typically implemented as a static random access memory (SRAM) array with low-latency and high bandwidth capability, while the global memory is typically implemented as a dynamic random access memory (DRAM) array external to the chip containing the multiple processor cores. A periodicity of data replenishment of the scratchpad is determined by the relationship between the size of the working set of the application and the physical capacity of the scratchpad. The larger the scratchpad, the less often the replenishment.

SUMMARY

A system and method are provided for augmenting capacity of the main on-chip scratchpad for a processing core.

In one aspect, a memory system configured to augment a capacity of a plurality of main scratchpads for a plurality of respective processing cores is presented, The memory system includes a global memory device coupled to a plurality of processing elements. The global memory device is positioned external to a chip on which the plurality of processing elements reside. The memory system also includes at least one main scratchpad coupled to the of the plurality of processing elements and the global memory device. The memory system further includes a plurality of auxiliary scratchpads coupled to the plurality of processing elements and the global memory device. At least a portion of the plurality of auxiliary scratchpads are configured as a unitary multichannel device. Accordingly, alleviating bandwidth constraints is implemented through devices that overcome the capacity constraints of existing memory-intensive systems, such as those implemented in neural network designs.

In another aspect, a method of assembling a memory system configured to augment a capacity of a plurality of main scratchpads for a plurality of respective processing cores is presented. The method includes positioning a plurality of processing elements on a chip and coupling a global memory device to the plurality of processing elements. The global memory device is positioned external to the chip. The method also includes coupling at least one main scratchpad to at least one processing element of the plurality of processing elements and the global memory device. The method further includes coupling a plurality of auxiliary scratchpads to the plurality of processing elements and the global memory device. At least a portion of the plurality of auxiliary scratchpads are configured as a unitary multichannel device. Accordingly, alleviating bandwidth constraints is implemented through devices that overcome the capacity constraints of existing memory-intensive systems, such as those implemented in neural network designs.

In yet another aspect, a computer system configured to augment a capacity of a plurality of main scratchpads for a plurality of respective processing cores is presented. The computer system includes a plurality of processing devices positioned on a chip. Each processing device of the one or more processing devices includes one or more processing elements. The computer system also includes at least one main scratchpad coupled to the one or more processing elements. The computer system further includes a global memory device coupled to the plurality of processing devices. The global memory device is positioned external to the chip and the global memory device is coupled to the at least one main scratchpad. The computer system also includes one or more auxiliary scratchpads coupled to the plurality of processing devices and the global memory device. At least a portion of the plurality of auxiliary scratchpads are configured as a unitary multichannel device. Accordingly, alleviating bandwidth constraints in implemented through devices that overcome the capacity constraints of existing memory-intensive systems, such as those implemented in neural network designs.

The present Summary is not intended to illustrate each aspect of every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1A:
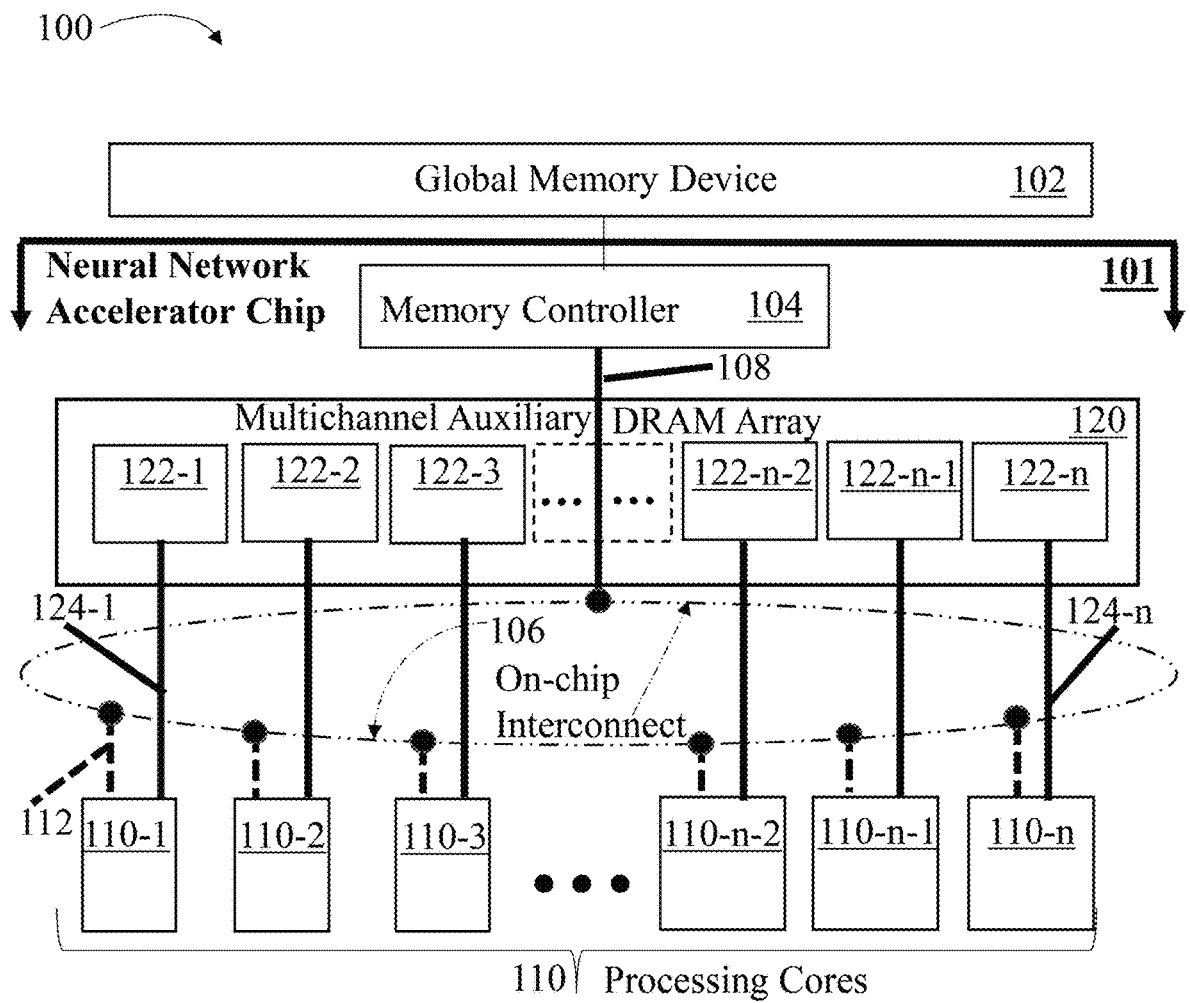
FIG. 1A is a block schematic diagram illustrating a memory system architecture including multichannel direct random access memory (DRAM) features, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to augmenting a capacity of the main on-chip scratchpad for a processing core. While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

In general, as the robustness of modern computing systems increase, additional memory strategies are implemented to reduce access times where performance is limited by the speed and efficiency of operations that use the memory bus. Use of memory controllers reduces access times somewhat, but typically do not overcome all of the limitations of a relatively remote memory bus from the processing devices. Merely increasing the amount of accessible memory does not alleviate the extended access times. In addition, defining a number of separate channels between the memory and the processing devices tends to decrease latencies; however, the use of software features to manage the data flow through the various channels may tend to add latencies back in. Other known solutions include the use of three-dimensional stacked DRAM (3D DRAM) to localizing communication between columns of memory elements and their underlying processor cores to improve access times. However, some of these solutions use a multiplexing device that somewhat increases the access times for certain operations.

More specifically, at least some known special purpose accelerators, e.g., and without limitation, deep-learning accelerators, include an interconnected set of processing cores within a multicore processing device, where each core uses a local memory, or scratchpad, for quick access to its working set, and can access a global memory device to periodically, or continually, replenish the contents of the scratchpad. The working set is the memory that a process requires in a given time interval. For example, with respect to the working set size, for a 100 gigabyte (GB) main memory system, only 50 megabytes (MB) may be necessary for a particular application for each second of operation; therefore, for such a scenario, 50 MB is the working set size.

The scratchpad is typically implemented as a static random access memory (SRAM) array directly positioned on the respective chip, or processing core, with low-latency and high bandwidth capability, where the close proximity of the main scratchpad and the processing elements facilitates the low-latency aspects of the on-chip devices. In contrast, the global memory is typically implemented as a dynamic random access memory (DRAM) array external to the chip containing the multiple processor cores. A periodicity of data replenishment of the scratchpad is determined by the relationship between the working set size of the application and the physical capacity of the scratchpad. Generally, scratchpads are distinguished from memory cache where the scratch pads tend to be more deterministic with respect to the data contents resident thereon, thereby facilitating fetch and prefetch operations for only certain data. Accordingly, for certain processing requirements, scratchpads are preferable to cache.

At least some known efforts to reduce these overheads and improve the utilization of the processing resources typically includes creating a memory hierarchy, where additional tiers of memory are directly inserted between the main scratchpad and the global memory device. These tiers are typically implemented as caches of the main global memory and replenishment is achieved by moving contents from one memory tier to the next memory tier in succession. When the movement between the tiers is implemented in hardware, special circuits are provided to determine which locations in each of the tiers are to be moved, and when they should be moved to maximize the utilization of processing resources. The additional hardware is used to both implement the tiers of memory on the same chip as the processor, and for controlling the transmission between the tiers, and this hardware can be quite complex. Moreover, the additional hardware components are typically not aware of the intentions of the programs executing on the processors, and hence unable to maximize processor utilization. They also consume valuable real estate on the processor chip, that could otherwise have been devoted to increasing the processing power of the chip.

In addition, some known efforts to reduce these overheads and improve the utilization of the processing resources typically includes increasing the size of the main scratchpad. In general, the larger the main scratchpad, the less often data replenishment is required. More frequent replenishment facilitates increasing the overhead in processing, both in terms of power to transmit data back and forth, and in terms of time needed for these transmissions. Moreover, the time needed for this transmission invariably causes an idling of the processing resources, and hence underutilization of the processor. However, merely increasing the size of the main scratchpad tends to contravene efforts to reduce the size of the chip on which the main scratchpad is resident. Therefore, the opportunity cost of implementing the additional tiers on-chip as described above is also a similar drawback of simply increasing the size of the local scratchpad memory. Additionally, increasing the size of the main scratchpad also increases the latency of access to the main scratchpad even for applications with smaller working sets that may not need the larger scratchpad memory resources.

Accordingly, there is a need for alleviating bandwidth constraints through devices that overcome the capacity constraints of existing memory-intensive systems, such as those implemented in neural network designs.

Referring to FIG. 1A, a block schematic diagram is presented illustrating a memory system architecture 100 (sometimes referred to as the memory system 100 herein) including multichannel direct random access memory (DRAM) features, in accordance with some embodiments of the present disclosure. In some embodiments, the memory system architecture 100 is integrated on a single die. In some embodiments, at least a portion of the memory system architecture 100 includes at least a portion of a neural network accelerator chip 101; however, the memory system architecture 100 is not limited to such implementation and is configured to be employed in any implementation and equipment architecture that enables operation of the memory system architecture 100 as described herein.

In some embodiments, the memory system architecture 100 includes a global memory device 102. The global memory device 102, in at least some embodiments, is implemented as a dynamic random access memory (DRAM) device. In some embodiments, the global memory device 102 is implemented as a DRAM array. In some embodiments, the global memory device 102 is on the same die as the neural network accelerator chip 101. In some embodiments, the global memory device 102 is integrated into a chip separate from the neural network accelerator chip 101 (as shown in FIG. 1A).

In one or more embodiments, the neural network accelerator chip 101 includes a memory controller 104 that is communicatively and operably coupled to the global memory device 102. The memory controller 104 is a device that manages the flow of data transmitted to, and transmitted from, the global memory device 102. In at least some embodiments, the neural network accelerator chip 101 includes an on-chip interconnect 106 that is communicatively and operably coupled to the memory controller 104 through an interconnect conduit 108. In addition, in some embodiments, the neural network accelerator chip 101 includes a plurality of processing cores 110 extending from processing core 110-1 through 110-n, where the processing core 110-n-1 is read as "the $n^{th}$-minus-1" processing core, etc., and where the variable "n" has any value that enables operation of the neural network accelerator chip 101, including, without limitation, values of 1 through 16. Each processing core 110 is communicatively coupled to the on-chip interconnect 106 through an on-chip interconnect channel 112 (shown in dashed phantom and only one labeled in FIG. 1A for clarity). The processing cores 110 are discussed further with respect to FIG. 1B.

Furthermore, the neural network accelerator chip 101 includes a multichannel memory array 120, herein referred to as the multichannel auxiliary DRAM array 120. The multichannel auxiliary DRAM array 120 is configured to augment the global memory device 102. In some embodiments, the multichannel auxiliary DRAM array 120 is a unitary device (as shown in FIG. 1A); however, in some embodiments the multichannel auxiliary DRAM array 120 is distributed into a plurality of auxiliary DRAM devices to allow for other chip architectural elements to be positioned most appropriately. The multichannel auxiliary DRAM array 120 includes a plurality of auxiliary DRAM elements, or channels, herein referred to as auxiliary scratchpads 122 extending from an auxiliary scratchpad 122-1 to an auxiliary scratchpad 122-n. Accordingly, the neural network accelerator chip 101 includes a plurality of multilateral segments in the form of auxiliary scratchpads 122, where at least a portion of the plurality of auxiliary scratchpads 122 are configured as a unitary multichannel device. i.e., one or more multichannel auxiliary DRAM arrays 120.

In some embodiments, each auxiliary scratchpad 122 is directly, communicatively, and operably coupled to a corresponding processing core 110 through an auxiliary scratchpad channel 124 (only two shown and labeled for clarity, i.e., 124-1 and 124-n), e.g., the auxiliary scratchpad 122-1 is coupled to the processing core 110-1 and the auxiliary scratchpad 122-n is coupled to the processing core 110-n. In some embodiments, in contrast to the one-to-one relationship between the auxiliary scratchpads 122 and the processing cores 110, at least some of the processing cores 110 are coupled to a plurality of auxiliary scratchpads 122. In some embodiments, the respective auxiliary scratchpad channel 124 cooperates with the associated auxiliary scratchpad 122 to define the respective auxiliary DRAM channels. In some embodiments, the global memory device 102 and the multichannel auxiliary DRAM array 120 are implemented physically alongside each other in a parallel configuration. Therefore, the multichannel auxiliary DRAM array 120, and the individual auxiliary scratchpads 122, are located off the respective processing cores (or chips) 110, thereby allowing the processing core chip 110 designers to use the unused portions of the processing core 110 for other features. Moreover, the use DRAM for the auxiliary scratchpads 122 facilitates taking advantage of the density of DRAM technology as opposed to the less dense SRAM or embedded-DRAM technologies. In some embodiments, such use of DRAM technology allows the auxiliary scratchpads 122 to contain the working set of, for example, and without limitation, large deep learning inference applications targeted to natural language understanding.

Figure 1B:
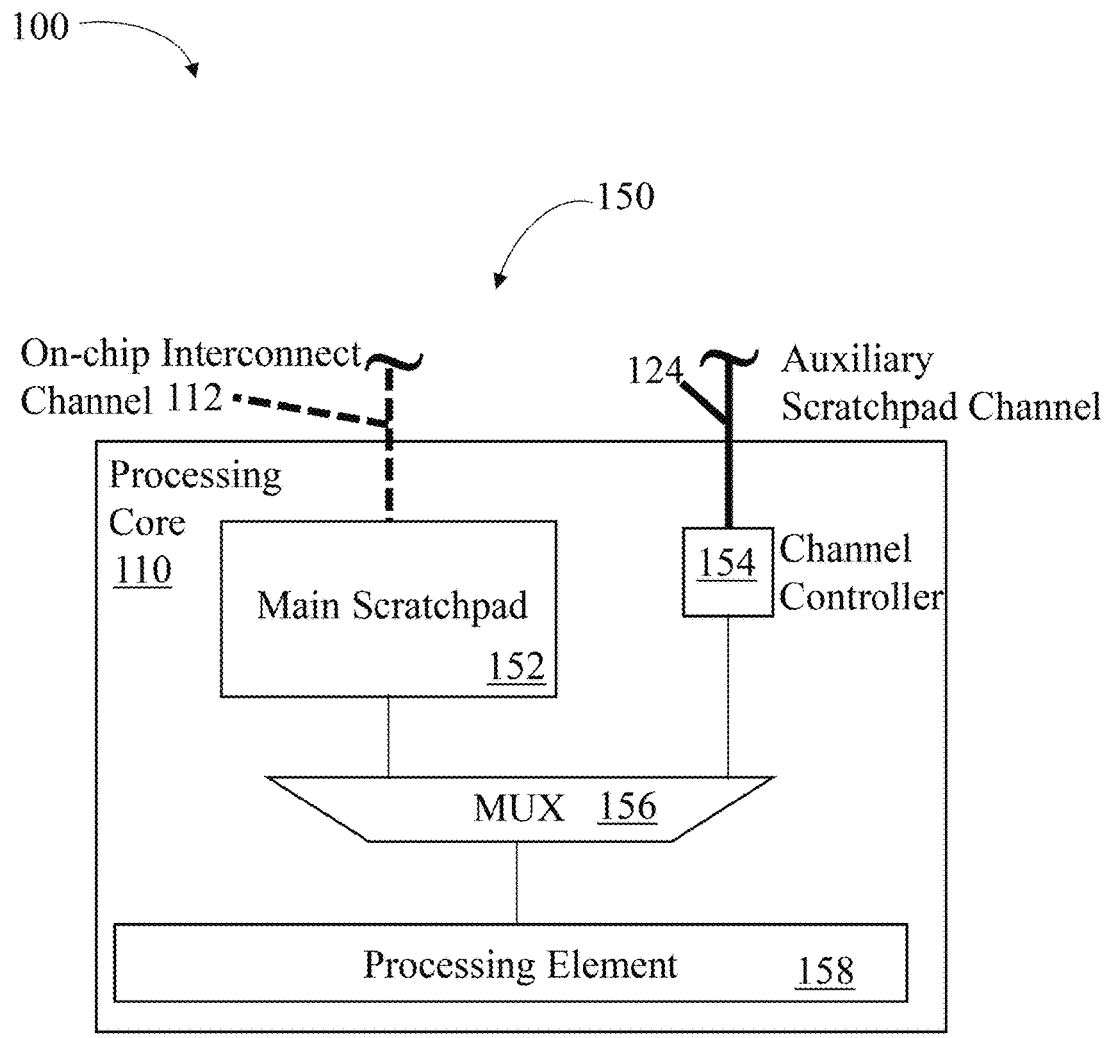
FIG. 1B is a block schematic diagram illustrating an enlarged view of a portion of the memory system architecture shown in FIG. 1A, in accordance with some embodiments of the present disclosure.

Referring to FIG. 1B, a block schematic diagram is presented illustrating an enlarged view of a portion 150 of the memory system architecture 100, and more specifically, a portion of the neural network accelerator chip 101 (shown in FIG. 1A), in accordance with some embodiments of the present disclosure, where reference to FIG. 1A is continued. In one or more embodiments, each processing core 110 includes a main on-chip scratchpad 152, referred to herein as the main scratchpad 152, coupled to the on-chip interconnect 106 through the respective on-chip interconnect channel 112. In some embodiments, the main scratchpad 152 at least partially defines the on-chip interconnect channel 112. In some embodiments, the main scratchpad 152 is configured as a static random access memory (SRAM) array directly positioned on the respective chip, or processing core 110, with low-latency and high bandwidth capabilities, where the close proximity of the main scratchpad 152 and the processing elements 158 facilitates the low-latency aspects of the on-chip devices of the memory system architecture 100. In some embodiments, the main scratchpad 152 has any memory architecture that enables operation of the memory system architecture 100, including the neural network accelerator chip 101, including, without limitation, a DRAM device.

Further, in some embodiments, each processing core 110 includes a channel controller 154 that is coupled to the respective auxiliary scratchpad 122 through the respective auxiliary scratchpad channel 124. The channel controller 154 is configured to manage the transmission of signals from the respective auxiliary scratchpad 122 to the processing element 158. In some embodiments, the channel controller 154 at least partially defines the auxiliary scratchpad channel 124. Also, in some embodiments, each processing core 110 includes a multiplexor (MUX) 156 that is configured to channel selected signals from the respective main scratchpad 152 and the respective auxiliary scratchpad 122 (through the channel controller 154) to the processing element 158 for the desired processing operations. Accordingly, the respective auxiliary scratchpads 122 are physically positioned off the chip with the processing core 110 and mapped to the respective processing elements 158 in parallel with the respective main scratchpad 152.

In some embodiments, by implementing the memory features of the auxiliary scratchpad 122 to augment the memory features of the main scratchpad 152, the contents of the memory as well as the orchestration of the movement of the contents back and forth from the respective processor cores 110 can be orchestrated completely in software, thus allowing the utilization of the processing resources to approach the theoretical maximum. In some embodiments, a reduction in the total energy consumption of the processing cores 110 may be realized due to the improvement in performance of the neural network accelerator chip 101 as a result of the memory system augmentation as described herein.

In at least some embodiments, the auxiliary scratchpad 122 is configured to facilitate the processing of static tensors and dynamic tensors within a neural network, such as those neural networks found within deep learning platforms, including, without limitation, the neural network accelerator chip 101 at least partially shown in FIGS. 1A and 1B. In addition, the auxiliary scratchpads described herein are suitable for use in the broader range of artificial intelligence platforms, including, without limitation, machine learning platforms. In general, a tensor represents a multi-dimensional array containing elements of a single data type configured to be used for arbitrary numeric computation. Therefore, in at least some embodiments, the deep learning tensors are configured as one or more matrices as represented using n-dimensional arrays (where the term "n-dimensional" as used with respect to the tensors is not associated with the variable number of processing cores 110 and auxiliary scratchpads 122 described herein). In one non-limiting example, numerical data in the form of 27 values is stored in a single array implemented as a single, contiguous block in memory as a 3-by-3-by-3 tensor, one value after another, where three dimensions is also non-limiting. In some embodiments, the tensors are static with respect to the shape, i.e., the number of dimensions and the extent of each dimension in the matrix do not change over time. One non-limiting example for the values for a static tensor include model weights that are read-only values and are employed during the definition (sometimes referred to as the inference time, where the model remains fixed) of a respective computational graph of nodes in the neural network corresponding to operations or variables therein. In contrast, in some embodiments, the tensors are dynamic, i.e., the values in these dynamic tensors are not fixed, and these dynamic tensors are produced as intermediate or final outputs, where the lifetime of these dynamic tensors is not necessarily for the full execution of the program. In some embodiments, for example, and without limitation, the matrix configuration with respect to the number of dimensions and the extent of each dimension within the array is subject to change during the course of execution of the respective computational graph.

In at least some embodiments, the auxiliary scratchpads 122 are configured to store static deep learning tensors including, without limitation, weighting values for facilitating the operation of the respective neural network. In contrast, the main scratchpad 152 is configured to retain the dynamic tensors that are also employed for facilitating the operation of the respective neural network, e.g., and without limitation, node activations. In some embodiments, the auxiliary scratchpads 122 are configured with a read bandwidth that is lower than the read bandwidth for the main scratchpad 152, where the more limited static contents of the auxiliary scratchpads 122 do not require the larger read bandwidths typically found in the main scratchpad 152. In addition, at least partially due to the aforementioned properties of the data stored in the auxiliary scratchpads 122, the write bandwidth of the auxiliary scratchpads 122 is lower than the read bandwidth of the auxiliary scratchpads 122. Accordingly, in such embodiments, the read/write bandwidths of the auxiliary scratchpads 122 do not need to be as large as the read/write bandwidths of the main scratchpads 152.

In some embodiments, the read/write bandwidths of the auxiliary scratchpads 122 are enlarged to accommodate storing dynamic tensors as necessary for those embodiments of the memory system 100 and the neural network accelerator chip 101 that require such configurations.

In one or more embodiments, the neural network accelerator chip 101 includes a one-to-one relationship between the auxiliary scratchpads 122 and the processing cores 110. In some embodiments, the neural network accelerator chip 101 includes a more than one-to-one relationship between the auxiliary scratchpads 122 and the processing cores 110, where one limiting factor includes the amount of remaining space availability with respect to the physical landscape of the neural network accelerator chip 101. Therefore, in some embodiments, a plurality of auxiliary scratchpads 122 are coupled to the respective MUX 156 through one of individual respective channel controllers 154 or a unitary multichannel controller (not shown). In some embodiments, the processing element 158 is configured to accommodate any number of auxiliary scratchpads 122, including, without limitation, 1 through 16 auxiliary scratchpads 122.

Figure 2A:
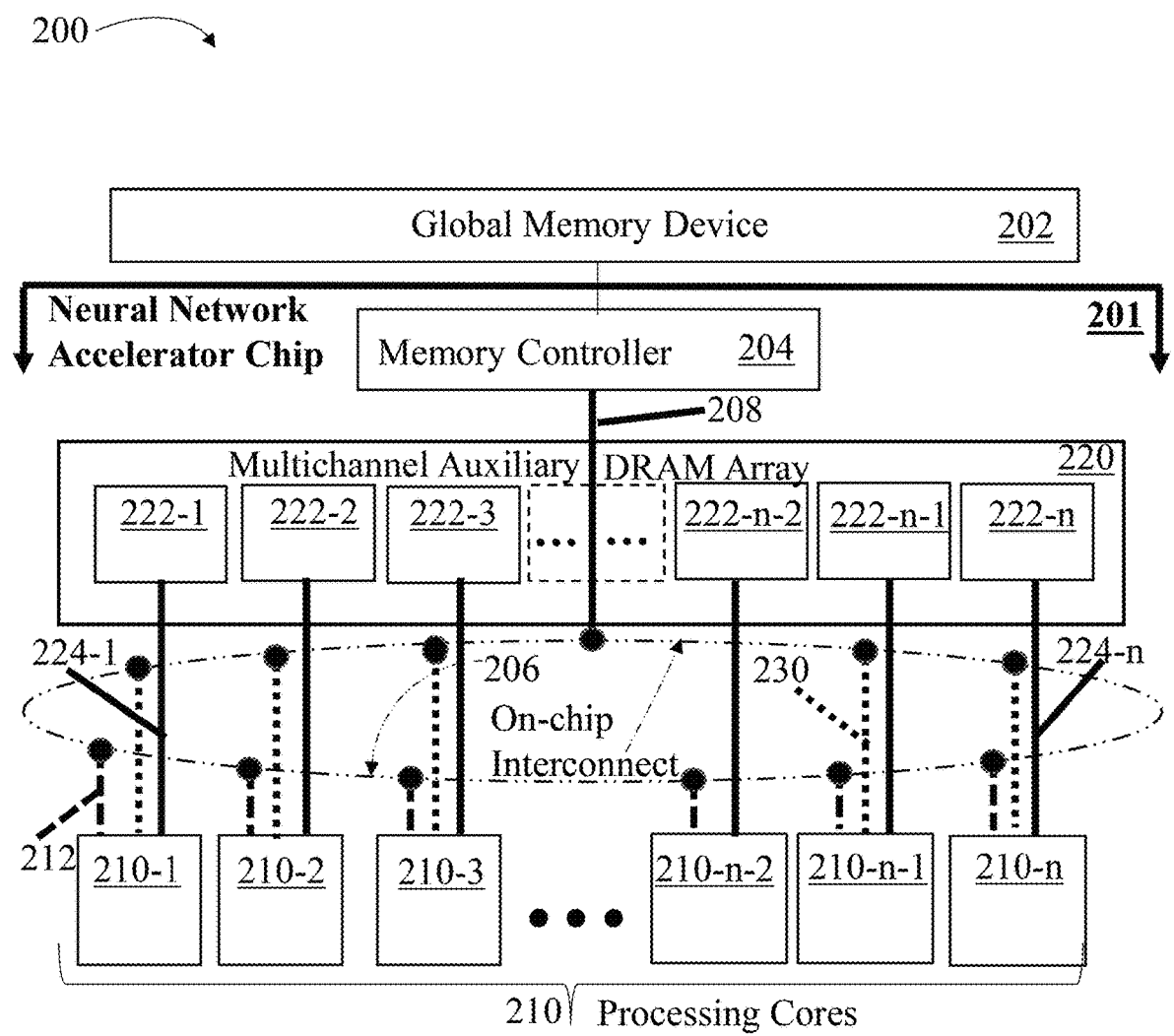
FIG. 2A is a block schematic diagram illustrating a memory system architecture including multichannel DRAM features, in accordance with some embodiments of the present disclosure.

Referring to FIG. 2A, a block schematic diagram is presented illustrating a memory system architecture 200 (sometimes referred to as the memory system 200 herein) including multichannel DRAM features, in accordance with some embodiments of the present disclosure. In many embodiments, the memory system 200 is similar to the memory system 100 (shown in FIGS. 1A and 1B), with one difference being the addition of a global channel 230 (only one labeled). Also, referring to FIG. 2B, a block schematic diagram is presented illustrating an enlarged view of a portion 250 of the memory system architecture 200 shown in FIG. 2A, in accordance with some embodiments of the present disclosure. Similarly numbered components in FIGS. 1A, 1B, 2A, and 2B are similarly named with similar functionality.

The global channel 230 is communicatively coupled to the on-chip interconnect 206, that is communicatively coupled to the global memory device 202. In addition, the global memory channel 230 is communicatively and operably coupled to each of the processing cores 210, thereby directly coupling the global memory device 202 to the processing cores 210. Such direct coupling facilitates those instances where there are data calls by the respective processing element 258 for data resident within other portions of the memory system 200.

In at least some embodiments, the global channel 230 is coupled to the channel controller 254 to facilitate managing the flow of information in and out of the mux 256 for the processing element 258. In some embodiments, the global channel 230 is coupled to the processing element 258 through any mechanism that enables operation of the memory system 200 as described herein.

Figure 2B:
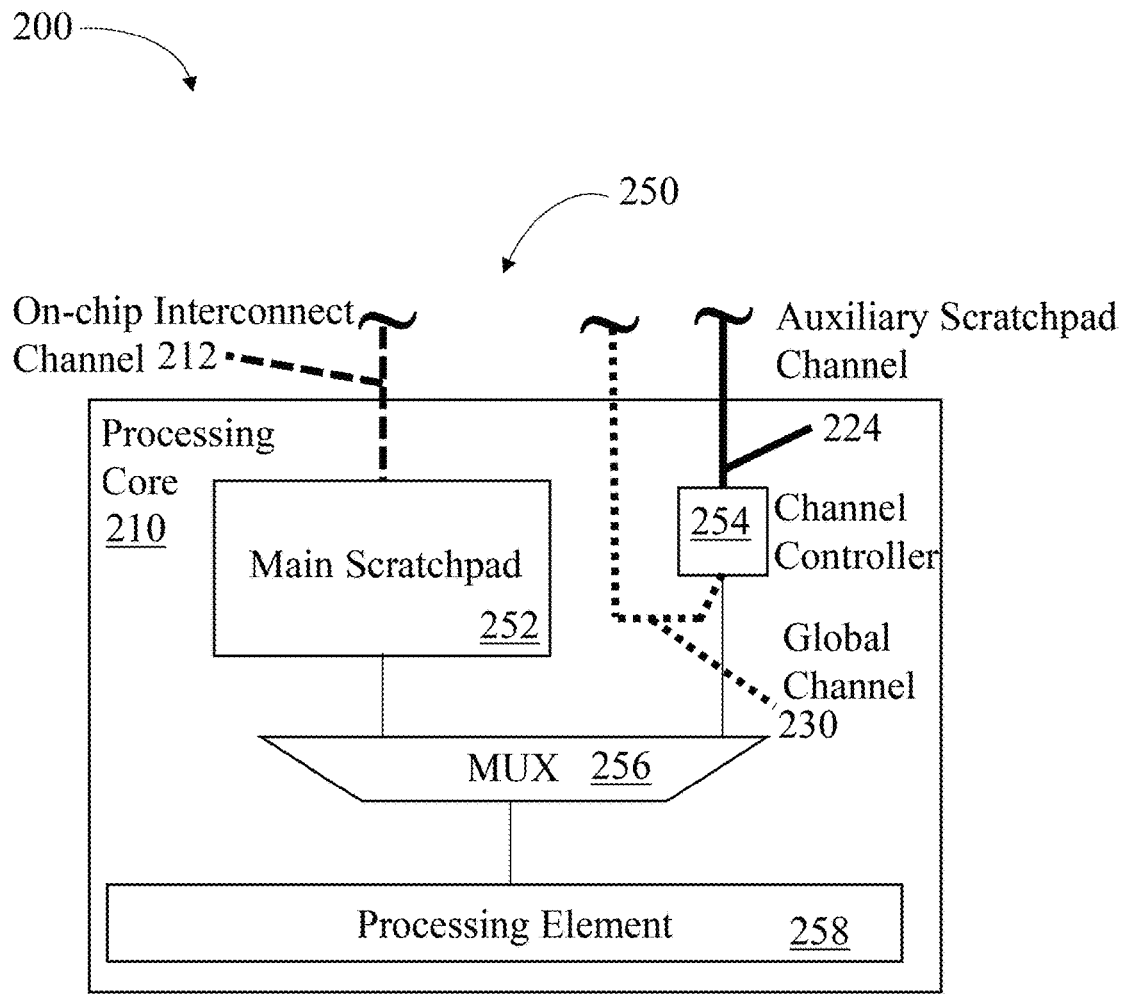
FIG. 2B is a block schematic diagram illustrating an enlarged view of a portion of the memory system architecture shown in FIG. 2A, in accordance with some embodiments of the present disclosure.
Figure 3A:
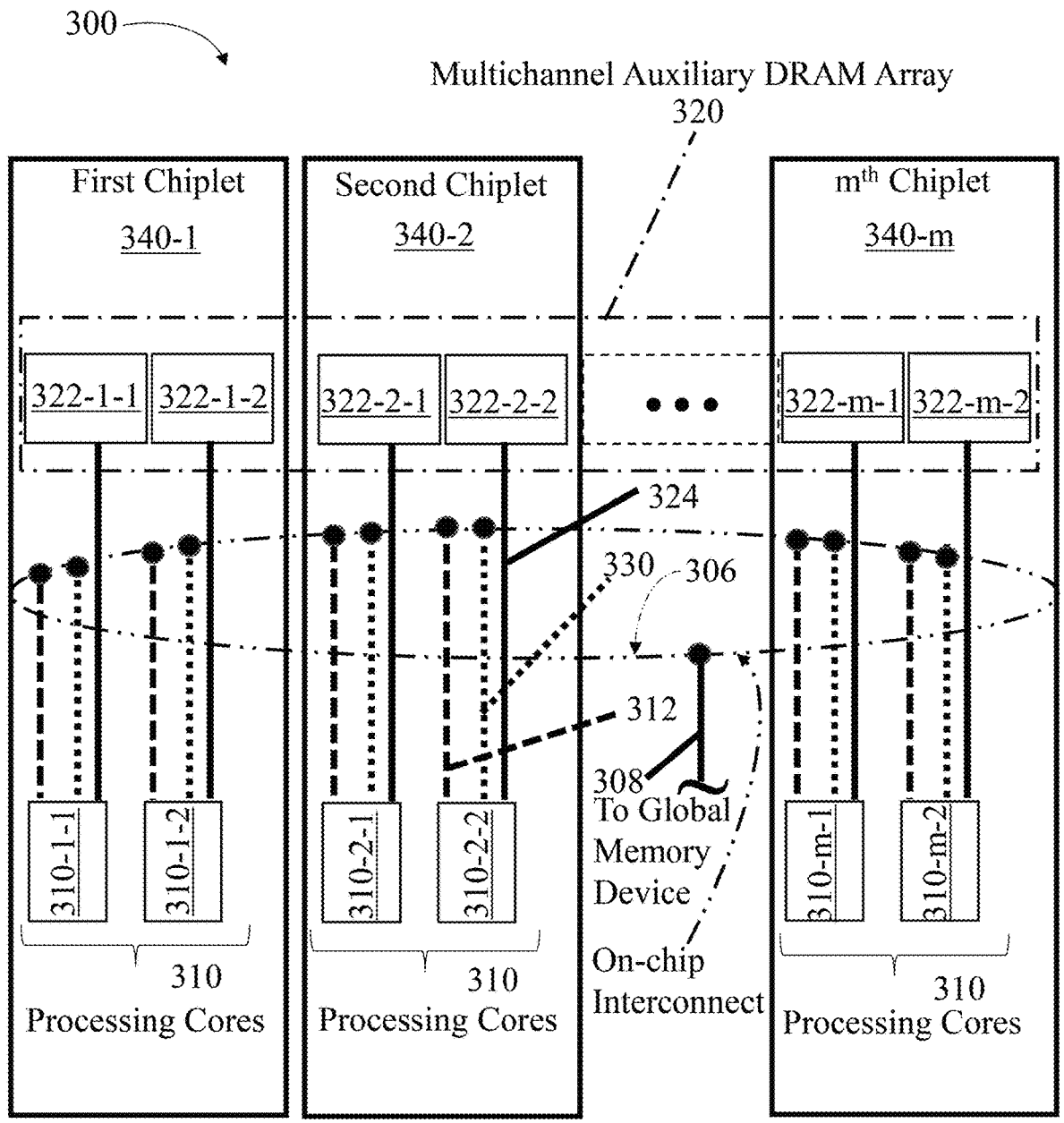
FIG. 3A is a block schematic diagram illustrating a memory system architecture including multichannel DRAM features, in accordance with some embodiments of the present disclosure.

Referring to FIG. 3A, a block schematic diagram is presented illustrating a memory system architecture 300 (sometimes referred to as the memory system 300 herein) including multichannel DRAM features, in accordance with some embodiments of the present disclosure. Similarly numbered components in FIGS. 1A, 1B, 2A, and 2B are similarly named with similar functionality, and reference to FIGS. 1A, 1B, 2A, and 2B continues.

In at least some embodiments, at least a portion of the memory system 300 includes one or more neural network accelerator chips in a manner similar to the network accelerator chips 101/201. In some embodiments, the memory system 300 includes an on-chip interconnect 306 that is substantially similar to the on-chip interconnects 106/206. In at least some embodiments, the memory system 300 includes a global memory device (that is substantially similar to the global memory devices 102/202) that is communicatively coupled to the on-chip interconnect 306 through a memory controller (that is substantially similar to the memory controllers 104/204) through the interconnect conduit 308 (that is substantially similar to the interconnect conduits 108/208), where the global memory device and the memory controller are not shown in FIG. 3A for clarity.

In one or more embodiments, the memory system 300 includes a plurality of chiplets 340, i.e., a first chiplet 340-1, a second chiplet 340-2, etc., through an $m^{th}$ chiplet 340-$m$, where the variable "m" has any value that enables operation of the memory system 300, including, without limitation, values of 1 through 16. In some embodiments, the chiplets 340 reside on the neural network accelerator chip (not shown in FIG. 3A) as described above. Each chiplet 340 includes one or more processing cores 310, where, for example, a non-limiting number of two processing cores 310-1-1 and 301-1-2 are shown for the first chiplet 340-1 in FIG. 3A. Similarly, the second chiplet 340-2 includes, for example, a non-limiting number of two processing cores 310-2-1 and 301-2-2, and the $m^{th}$ chiplet 340-$m$ includes, for example, a non-limiting number of two processing cores 310-$m$-1 and 301-$m$-2. In some embodiments, each chiplet 340 includes any number of processing cores 310 that enables operation of the memory system 300 as described herein, including, without limitation, 1 through 16 processing cores 310. Each processing core 310 is communicatively coupled to the on-chip interconnect 306 through an on-chip interconnect channel 312 (shown in dashed phantom and only one labeled in FIG. 3A for clarity). The processing cores 310 are discussed further with respect to FIG. 3B.

Further, in at least some embodiments, each chiplet 340 includes one or more auxiliary DRAM elements, or channels, herein referred to as auxiliary scratchpads 322. As shown in FIG. 3A, each chiplet 340 includes one or more auxiliary scratchpads 322, where, for example, a non-limiting number of two auxiliary scratchpads 322-1-1 and 322-1-2 are shown for the first chiplet 340-1 in FIG. 3A. Similarly, the second chiplet 340-2 includes, for example, a non-limiting number of two auxiliary scratchpads 322-2-1 and 322-2-2, and the $m^{th}$ chiplet 340-$m$ includes, for example, a non-limiting number of two auxiliary scratchpads 322-$m$-1 and 322-$m$-2. In some embodiments, each chiplet 340 includes any number of auxiliary scratchpads 322 that enables operation of the memory system 300 as described herein, including, without limitation, 1 through 16 auxiliary scratchpads 322.

In some embodiments, the plurality of auxiliary scratchpads 322 for each chiplet 340 are individual elements positioned the respective chiplets 340 such that each chiplet 340 is a unitary device. In contrast, in some embodiments, the plurality of chiplets 340 are formed as a separate multichannel auxiliary DRAM array 320 that is coupled across the full set of chiplets 340 (as shown in FIG. 3A with the single-dashed/single-dotted lines). Accordingly, in such embodiments, the multichannel auxiliary DRAM array 320 includes a plurality of multilateral segments in the form of auxiliary scratchpads 322, where at least a portion of the plurality of auxiliary scratchpads 322 are configured as a unitary multichannel device, e.g., each chiplet 340 and the multichannel auxiliary DRAM array 320 are such devices.

In some embodiments, each auxiliary scratchpad 322 is directly, communicatively, and operably coupled to a corresponding processing core 310 through an auxiliary scratchpad channel 324 (only one shown and labeled for clarity), e.g., the auxiliary scratchpad 322-1-1 is coupled to the processing core 310-1-1 and the auxiliary scratchpad 322-$m$-2 is coupled to the processing core 310-$m$-2. In some embodiments, in contrast to the one-to-one relationship between the auxiliary scratchpads 322 and the processing cores 310, at least some of the processing cores 310 are coupled to a plurality of auxiliary scratchpads 322. In some embodiments, the respective auxiliary scratchpad channel 324 cooperates with the associated auxiliary scratchpad 322 to define the respective auxiliary DRAM channels.

Figure 3B:
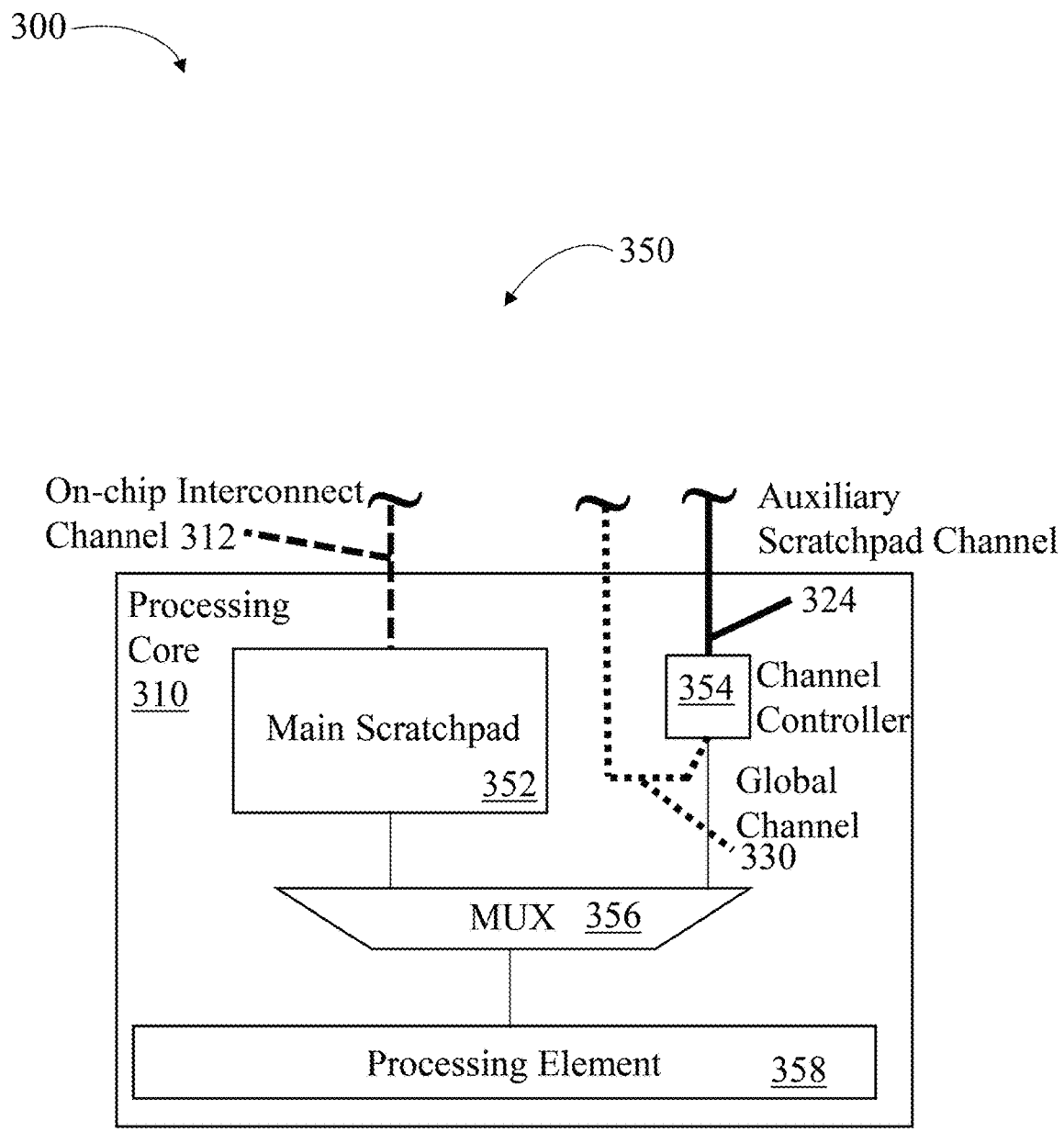
FIG. 3B is a block schematic diagram illustrating an enlarged view of a portion of the memory system architecture shown in FIG. 3A, in accordance with some embodiments of the present disclosure.

Referring to FIG. 3B, a block schematic diagram is presented illustrating an enlarged view of a portion 350 of the memory system architecture 300 shown in FIG. 3A, in accordance with some embodiments of the present disclosure. In many embodiments, the portion 350 of the memory system 300 is substantially similar to the portion 250 of the memory system 200. Similarly numbered components in FIGS. 2B and 3B are similarly named with similar functionality.

Figure 4:
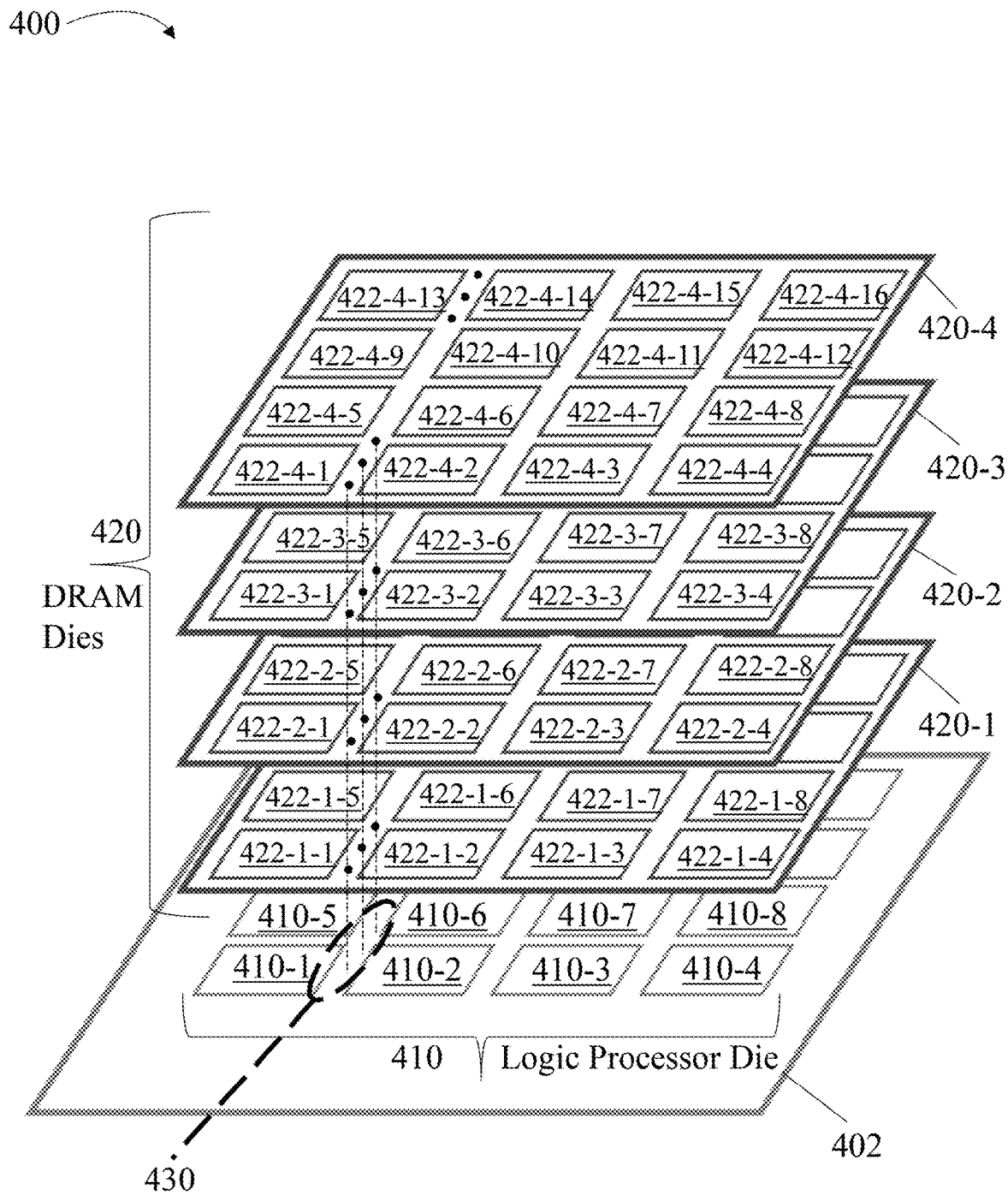
FIG. 4 is a block schematic diagram illustrating a memory system architecture including multichannel DRAM features, in accordance with some embodiments of the present disclosure.

Referring to FIG. 4, a block schematic diagram is presented illustrating a memory system architecture 400 including multichannel DRAM features, in accordance with some embodiments of the present disclosure. Also referring to FIGS. 1A, 1B, 2A, 2B, 3A, and 3B, in at least some embodiments, the memory system architecture 400 includes at least one logic processor die 402, where the number one is non-limiting. In some embodiments, the logic processor die 402 includes a plurality of processing cores 410 that are substantially similar to the processing cores 110, 210, and 310. The logic processor die 402 includes any number of processing cores 410 that enables operation of the memory systems 100, 200, 300, and 400 as described herein including, without limitation, 1 through 16, where 16 units of processing cores 410 are shown in FIG. 4, and 8 processing cores 410 are labeled from processing core 410-1 to 410-8.

In addition, in some embodiments, the memory system architecture 400 includes a plurality of DRAM dies 420. In some embodiments, the DRAM dies 420 are similar to the multichannel auxiliary DRAM arrays 120, 220, or 320. The memory system architecture 400 includes any number of DRAM dies 420 that enables operation of the memory systems 100, 200, 300, and 400 as described herein including, without limitation, 1 through 16, where 4 units of DRAM dies 420 are shown in FIG. 4, i.e., DRAM dies 420-1, 420-1, 420-3, and 420-4. As shown, the memory system architecture 400 defines a three-dimensional (3D) stacked configuration. In some embodiments, the number of stacked DRAM dies 420 is subject to environmental conditions, including, without limitation, thermal considerations with respect to heat generation and removal. In addition, the number of stacked DRAM dies 420 chosen is subject to chip design considerations with respect to positioning of the various components thereon, and the practical limitations based on modern chip manufacturing techniques and the structural strength requirements of the DRAM dies 420.

In one or more embodiments, each DRAM die 420 includes a plurality of auxiliary scratchpads 422 that are substantially similar to the auxiliary scratchpad 122. In some embodiments the plurality of auxiliary scratchpads 422 are substantially similar to the auxiliary scratchpads 222 and 322. In some embodiments, each DRAM die 420 includes any number of auxiliary scratchpads 422 that enables operation of the memory systems 100, 200, 300, and 400 as described herein including, without limitation, 1 through 16, where 16 units of auxiliary scratchpads 422 are shown for each of the four DRAM dies 420 in FIG. 4, and 8 processing cores 410 are labeled from processing core 410-1 to 410-8. In some embodiments, electric connections through the stack are facilitated through a plurality of through silicon vias (TSVs) 430. Communications between the processing cores 410 and the auxiliary scratchpads 422 are discussed with respect to FIGS. 1A, 1B, 2A, 2B, 3A, and 3B.

As shown in FIG. 4, in some embodiments, each processor core 410 is communicatively and operably coupled to four auxiliary scratchpads 422. For example, the processor core 410-1 is coupled to the auxiliary scratchpads 422-1-1, 422-2-1, 422-3-1, and 422-4-1. In some embodiments, the processor cores 410 are coupled to any number of auxiliary scratchpads 422 that enables operation of the memory system architecture 400 as described herein.

Figure 5:
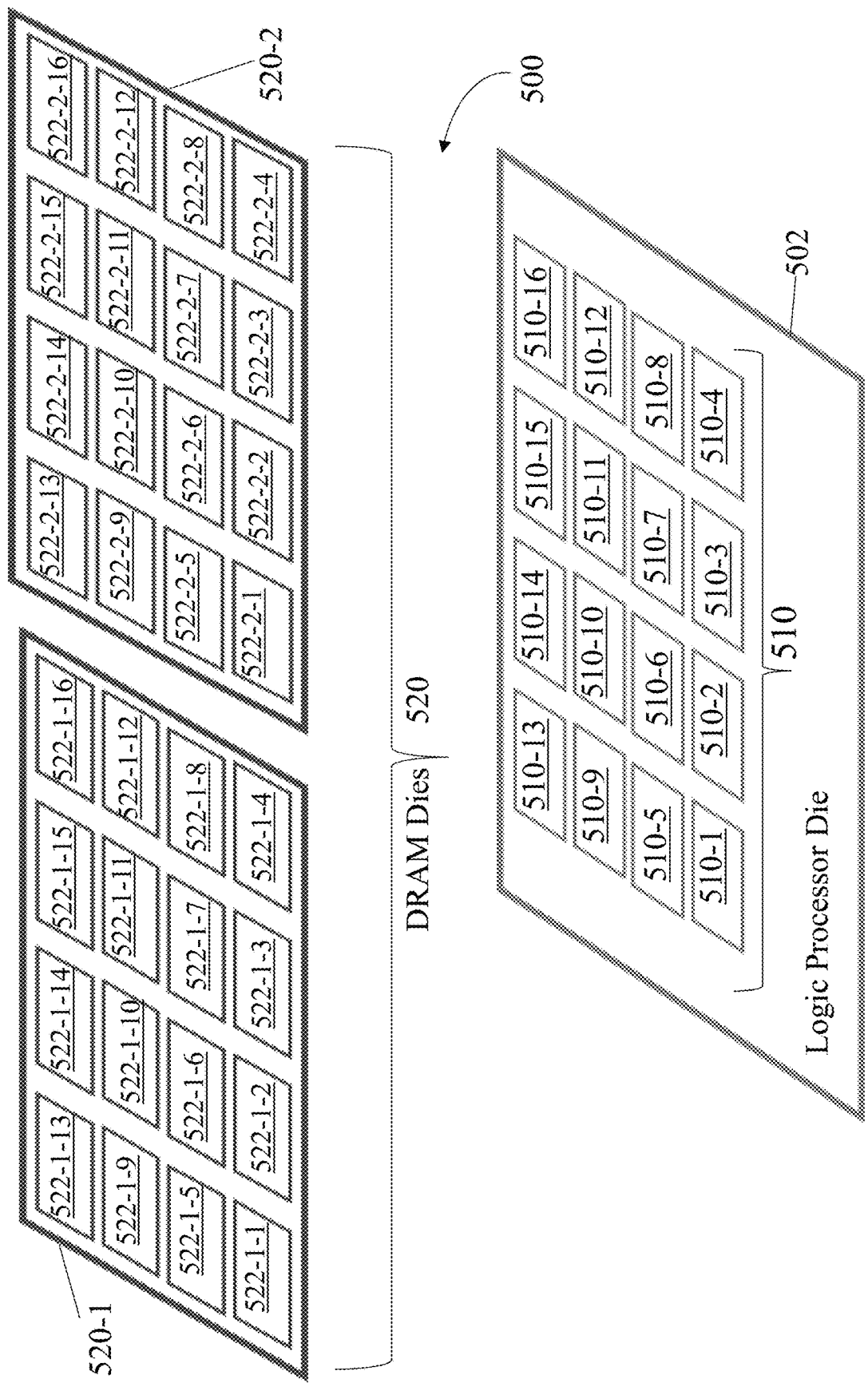
FIG. 5 is a block schematic diagram illustrating a memory system architecture including multichannel DRAM features, in accordance with some embodiments of the present disclosure.

Referring to FIG. 5, a block schematic diagram is presented illustrating a memory system architecture 500 including multichannel DRAM features, in accordance with some embodiments of the present disclosure. The memory system architecture 500 is similar to the memory system architecture 400 (shown in FIG. 4, also continued to be referred to); however, rather than a stacked configuration, the memory system architecture 500 is a parallel configuration. Therefore, the memory system architecture 500 includes at least one logic processor die 502 that is similar to the logic processor die 402. In addition, in some embodiments, the memory system architecture 500 includes one or more DRAM dies 520, where two DRAM dies 520-1 and 520-2 are shown. The DRAM dies 520 are similar to the DRAM dies 420. Communications between the processing cores 510 and the auxiliary scratchpads 522 are discussed with respect to FIGS. 1A, 1B, 2A, 2B, 3A, and 3B.

Figure 6:
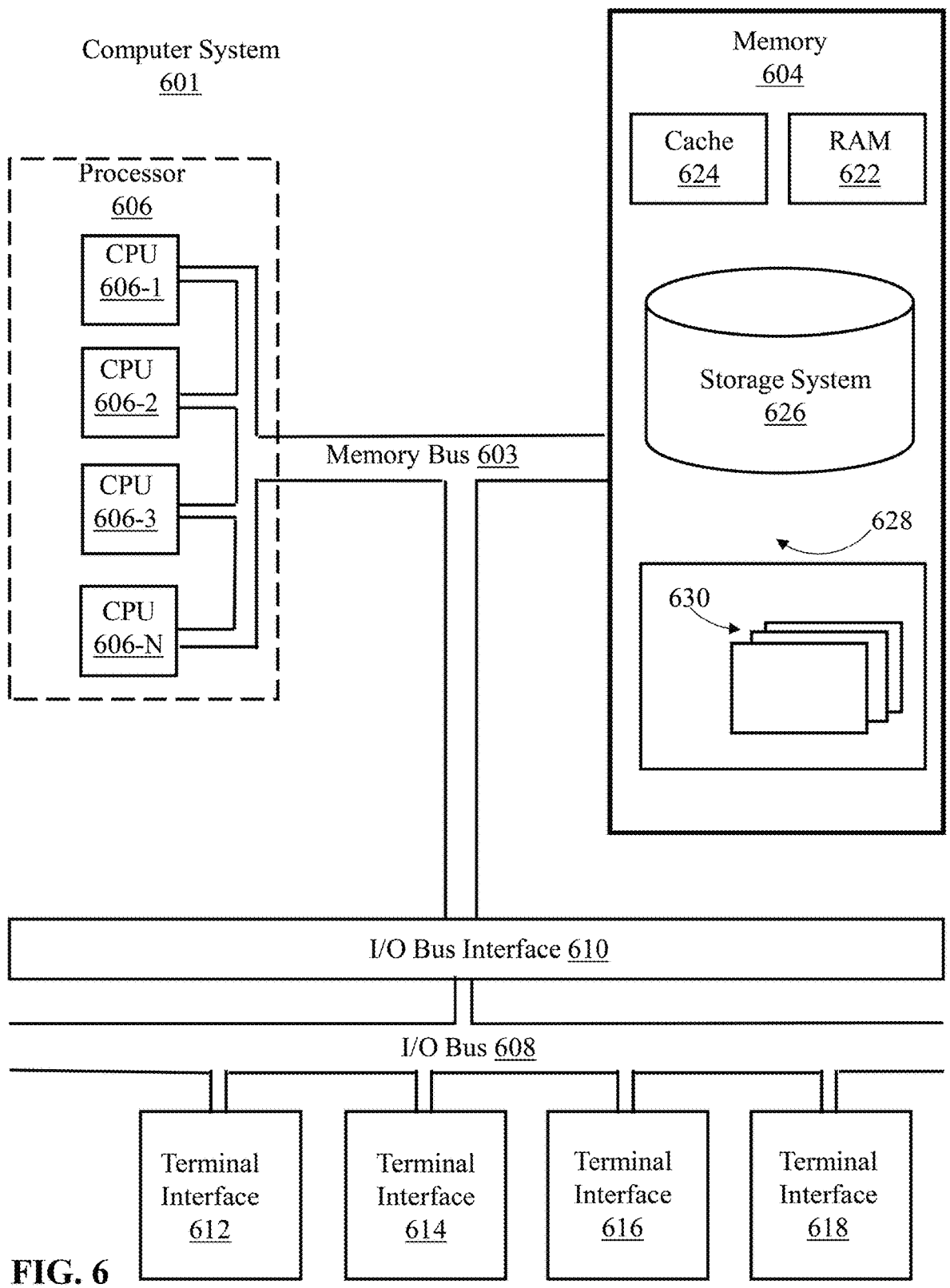
FIG. 6 is a block schematic diagram illustrating a computing system, in accordance with some embodiments of the present disclosure.

Referring now to FIG. 6, a block schematic diagram is provided illustrating a computing system 601 that may be used in implementing one or more of the methods, tools, and modules, and any related functions, described herein (e.g., using one or more processor circuits or computer processors of the computer), in accordance with some embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602-1, 602-2, 602-3, 602-N, herein collectively referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Moreover, the global memory devices, the main scratchpads, and the auxiliary scratchpads as described herein are included as a portion of the described suite of memory devices. Memory devices can be connected to memory bus 603 by one or more data media interfaces. The memory 604 may include at least one program product having a set (e.g., at least one) of program modules that are configured to carry out the functions of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

Figure 7:
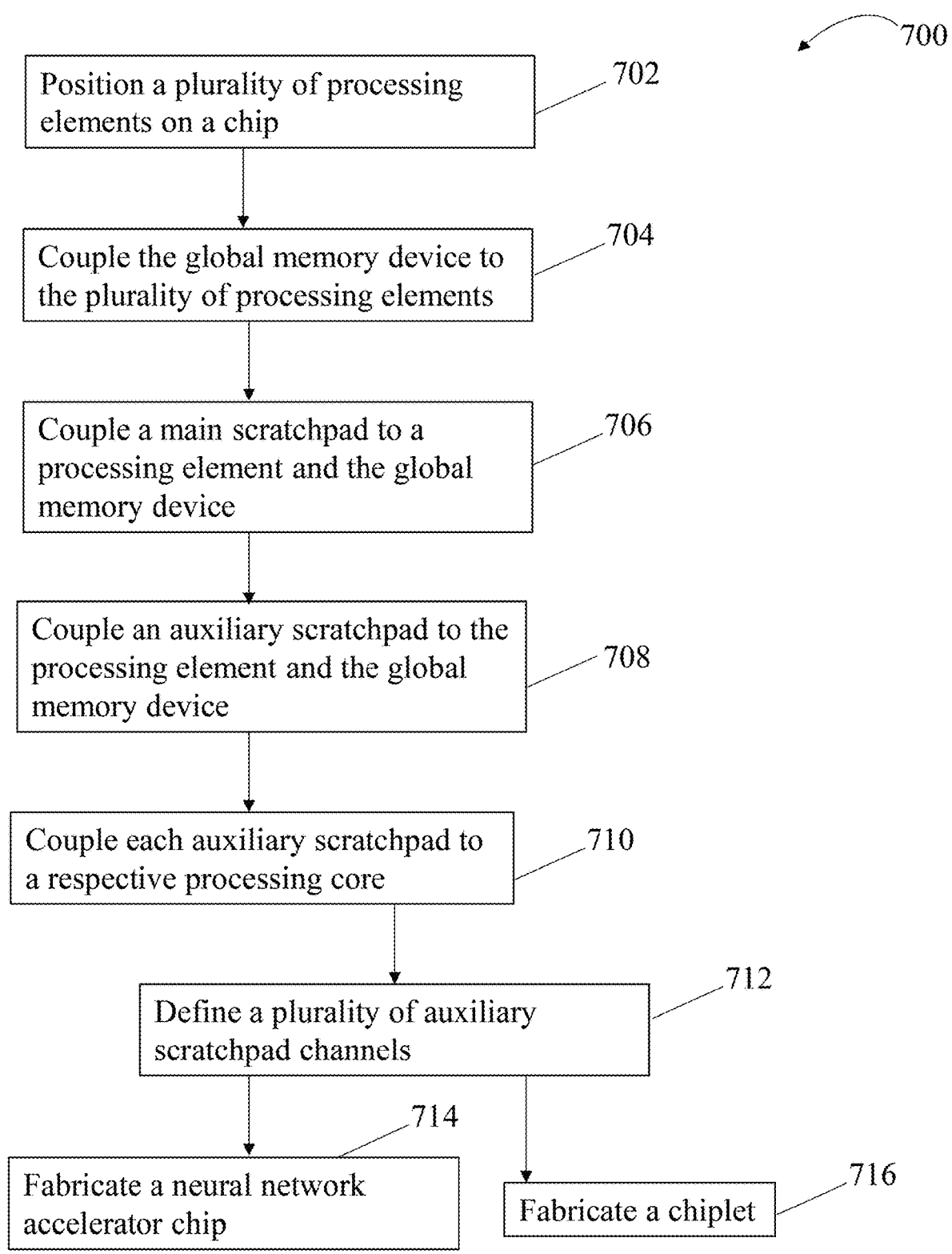
FIG. 7 is a flowchart illustrating a process for assembling a computer system, in accordance with some embodiments of the present disclosure.

Referring to FIG. 7A, a flowchart is provided illustrating a process 700 for assembling a computer system, such as the computer system 600 (see FIG. 6). Also referring to FIGS. 1A, 1B, 2A, 2B, 3A, 3B, 4, 5, and 6, the process 700 includes positioning 702 a plurality of processing elements 158/258/358 on a chip 101/201. The process 700 also includes coupling 704 the global memory device 102/202 to the plurality of processing elements 158/258/358, where the global memory device 102/202 is positioned external to the chip 101/201. The process 700 further includes coupling 706 at least one main scratchpad 152/252/352 to the at least one processing element of the plurality of processing elements 158/258/358 and the global memory device 102/202. The process 700 also includes coupling 708 a plurality of auxiliary scratchpads 122/222/322 to the respective processing elements 158/258/358 and the global memory device 102/202. At least a portion of the plurality of auxiliary scratchpads 122/222/322 are configured as a unitary multichannel device, i.e., either the multichannel auxiliary DRAM arrays 120/230/330 and the chiplets 340.

The process 700 also includes coupling 710 each auxiliary scratchpad 122/222/322 to a respective processing core 110/210/310, thereby defining 712 a plurality of auxiliary scratchpad channels 124/224/324. In some embodiments, coupling a channel controller 154/254/354 to the respective auxiliary scratchpad 122/222/322 further defines 712 the respective auxiliary scratchpad channel 124/224/324. In some embodiments, a neural network accelerator chip 101/201 is fabricated 714. In some embodiments, the plurality of chiplets 340 are fabricated 716. Both the neural network accelerator chip 101/201 and the chiplets 340 include the main scratchpad 152/252/352, the processing element 158/258/358, and the auxiliary scratchpad 122/222/322.

The embodiments as disclosed and described herein are configured to provide an improvement to computer technology. Materials, operable structures, and techniques as disclosed herein can provide substantial beneficial technical effects. Some embodiments may not have all of these potential advantages and these potential advantages are not necessarily required of all embodiments. By way of example only, and without limitation, one or more embodiments may provide enhancements of the operation of memory systems through the addition of dedicated auxiliary scratchpad memories to the individual processor cores.

In at least some embodiments as described herein, the enhancement of the memory systems includes higher bandwidths since the off-chip memory bandwidths are typically limited by the respective packaging features. In addition, as the computing performance of modern computing systems increases, the memory bandwidth is also increased in proportion to the compute gains for balanced system performance. In addition, the use of off-chip memory access is relatively power-intensive as compared to on-chip memory access. Therefore, the embodiments described herein, including the 3D stacked embodiments, with the close proximity of the processor cores and the auxiliary DRAM scratchpads on the same chip facilitate decreasing the power consumption of the associated computer system. Furthermore, the 3D stacked DRAM embodiments described herein facilitate greater memory density than on-die SRAM; therefore, the embodiments described herein facilitate a much greater memory capacity in a smaller form factor thereby facilitating larger memory capacities. Moreover, with respect to the form factors, the embodiments described herein facilitate reducing reliance on memory packages external to the chip, thereby reducing, and in some cases, eliminating the need for external memory packages.

In one or more embodiments described herein, additional benefits are attained when executing smaller batch cases more quickly through the respective computing systems for those operations where amortization of the costs associated with importing the various weighting values is not feasible, i.e., such costs are not recoverable.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory system configured to augment a capacity of a plurality of main scratchpads for a plurality of respective processing cores, the memory system comprising:

a global memory device coupled to a plurality of processing elements, wherein the global memory device is positioned external to a chip on which the plurality of processing elements reside;
at least one main scratchpad coupled to at least one processing element of the plurality of processing elements and the global memory device; and
a plurality of auxiliary scratchpads coupled to the plurality of processing elements and the global memory device, wherein at least a portion of the plurality of auxiliary scratchpads are configured as a unitary multichannel device.

2. The memory system of claim 1, wherein:
the plurality of auxiliary scratchpads are configured as dynamic random access memory (DRAM).

3. The memory system of claim 2, wherein:
the plurality of auxiliary scratchpads define a multichannel auxiliary DRAM array.

4. The memory system of claim 3, wherein:
the plurality of processing elements comprises a plurality of processing cores;
each auxiliary scratchpad of the plurality of auxiliary scratchpads is coupled to a respective processing core of the plurality of processing cores, thereby defining a plurality of auxiliary scratchpad channels.

5. The memory system of claim 4 further comprising:
a channel controller coupled to one or more auxiliary scratchpads of the plurality of auxiliary scratchpads, thereby further defining an auxiliary scratchpad channel of the plurality of auxiliary scratchpad channels.

6. The memory system of claim 1 further comprising:
a plurality of chiplets, wherein each chiplet of the plurality of chiplets comprises:
the at least one main scratchpad;
the at least one processing element; and
one or more auxiliary scratchpads of the plurality of auxiliary scratchpads.

7. The memory system of claim 1 further comprising:
an on-chip interconnect coupled to each of the global memory device, at least one processing element of the plurality of processing elements, the at least one main scratchpad, and the plurality of auxiliary scratchpads.

8. A method of assembling a memory system configured to augment a capacity of a plurality of main scratchpad for a plurality of respective processing cores, the method comprising:
positioning a plurality of processing elements on a chip;
coupling a global memory device to the plurality of processing elements, wherein the global memory device is positioned external to the chip;
coupling at least one main scratchpad to at least one processing element of the plurality of processing elements and the global memory device; and
coupling a plurality of auxiliary scratchpads to the plurality of processing elements and the global memory device, wherein at least a portion of the plurality of auxiliary scratchpads are configured as a unitary multichannel device.

9. The method of claim 8 further comprising:
configuring the plurality of auxiliary scratchpads as dynamic random access memory (DRAM).

10. The method of claim 9 further comprising:
assembling the plurality of auxiliary scratchpads to define a multichannel auxiliary DRAM array.

11. The method of claim 10 further comprising:
coupling each auxiliary scratchpad of the plurality of auxiliary scratchpads to a respective processing core of the plurality of processing cores, thereby defining a plurality of auxiliary scratchpad channels.

12. The method of claim 11 further comprising:
coupling a channel controller to one or more auxiliary scratchpads of the plurality of auxiliary scratchpads, thereby further defining an auxiliary scratchpad channel of the plurality of auxiliary scratchpad channels.

13. The method of claim 8 further comprising:
assembling a plurality of chiplets, wherein each chiplet of the plurality of chiplets includes:
the at least one main scratchpad;
the at least one processing element; and
one or more auxiliary scratchpads of the plurality of auxiliary scratchpads.

14. A computer system configured to augment a capacity of a plurality of main scratchpads for a plurality of respective processing core, the computer system comprising:
a plurality of processing devices positioned on a chip, each processing device of the plurality of processing devices comprises:
one or more processing elements; and
at least one main scratchpad coupled to the one or more processing elements;
a global memory device coupled to the plurality of processing devices, wherein the global memory device is positioned external to the chip, the global memory device coupled to the at least one main scratchpad; and
a plurality of auxiliary scratchpads coupled to the plurality of processing devices and the global memory device, wherein at least a portion of the plurality of auxiliary scratchpads are configured as a unitary multichannel device.

15. The computer system of claim 14, wherein:
the plurality of auxiliary scratchpads are configured as dynamic random access memory (DRAM).

16. The computer system of claim 15, wherein:
the plurality of auxiliary scratchpads define a multichannel auxiliary DRAM array.

17. The computer system of claim 16, wherein:
the plurality of processing devices comprise a plurality of processing cores;
each auxiliary scratchpad of the plurality of auxiliary scratchpads is coupled to a respective processing core of the plurality of processing cores, thereby defining a plurality of auxiliary scratchpad channels.

18. The computer system of claim 17 further comprising:
a channel controller coupled to one or more auxiliary scratchpads of the plurality of auxiliary scratchpads, thereby further defining an auxiliary scratchpad channel of the plurality of auxiliary scratchpad channels.

19. The computer system of claim 14 further comprising:
a plurality of chiplets, wherein each chiplet of the plurality of chiplets comprises:
the at least one main scratchpad;
the at least one processing device; and
one or more auxiliary scratchpads of the plurality of auxiliary scratchpads.

20. The computer system of claim 14 further comprising:
an on-chip interconnect coupled to each of the global memory device, at least one processing element of the plurality of processing elements, the at least one main scratchpad, and the plurality of auxiliary scratchpads.

* * * * *